(12) United States Patent
Kong et al.

(10) Patent No.: US 11,837,458 B2
(45) Date of Patent: *Dec. 5, 2023

(54) SUBSTRATE WITH GRADIATED DIELECTRIC FOR REDUCING IMPEDANCE MISMATCH

(71) Applicant: Intel Corporation, Santa Clara, CA (US)

(72) Inventors: Jackson Chung Peng Kong, Tanjung Tokong (MY); Bok Eng Cheah, Bukit Gambir (MY); Ping Ping Ooi, Butterworth (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 17/498,089

(22) Filed: Oct. 11, 2021

(65) Prior Publication Data

US 2022/0102295 A1    Mar. 31, 2022

Related U.S. Application Data

(63) Continuation of application No. 16/473,962, filed as application No. PCT/US2017/067366 on Dec. 19, 2017, now Pat. No. 11,164,827.

(30) Foreign Application Priority Data

Dec. 30, 2016   (MY) ............................... 2016704903

(51) Int. Cl.
*H01L 23/66*  (2006.01)
*H01L 21/48*  (2006.01)
(Continued)

(52) U.S. Cl.
CPC ............ *H01L 23/66* (2013.01); *H01L 21/481* (2013.01); *H01L 21/486* (2013.01);
(Continued)

(58) Field of Classification Search
CPC ..... H01L 23/66; H01L 21/481; H01L 21/486; H01L 23/49827; H01L 23/49894;
(Continued)

(56) References Cited

U.S. PATENT DOCUMENTS 11,164,827 B2 *  11/2021  Kong ..................... H05K 1/024
2003/0038344 A1    2/2003  Palmer et al.
(Continued)

FOREIGN PATENT DOCUMENTS

| KR | 1020070013252 A | 1/2007 |
| MY | 191331 A | 6/2022 |
| WO | WO-2018125679 A1 | 7/2018 |

OTHER PUBLICATIONS

"Malaysia Application Serial No. 2016704903, Substantive Examination Adverse Report dated Feb. 10, 2022", 3 pgs.
(Continued)

*Primary Examiner* — Patricia D Valenzuela
(74) *Attorney, Agent, or Firm* — Compass IP Law PC

(57) ABSTRACT

An electronic circuit including a substrate having a first dielectric characteristic. The substrate can include a first side and a second side. An intermediary material can be disposed within the substrate. For instance, the intermediary material can be located between the first side and the second side. The intermediary material can include a second dielectric characteristic, where the second dielectric characteristic is different than the first dielectric characteristic. A first conductive layer can be disposed on the first side, and a second conductive layer can be disposed on the second side. A conductive path can be electrically coupled between the first
(Continued)

conductive layer and the second conductive layer. The conductive path can be in contact with at least a portion of the intermediary material.

18 Claims, 8 Drawing Sheets

(51) Int. Cl.
*H01L 23/498* (2006.01)
*H01L 21/768* (2006.01)
*H01L 23/48* (2006.01)
*H05K 3/00* (2006.01)
*H05K 3/42* (2006.01)

(52) U.S. Cl.
CPC .. *H01L 23/49827* (2013.01); *H01L 23/49894* (2013.01); *H01L 21/76898* (2013.01); *H01L 23/481* (2013.01); *H01L 2223/6616* (2013.01); *H05K 3/0094* (2013.01); *H05K 3/426* (2013.01)

(58) Field of Classification Search
CPC ............. H01L 21/76898; H01L 23/481; H01L 2223/6616; H01L 2224/16225; H01L 2924/15311; H05K 1/0251; H05K 1/116; H05K 2201/0187; H05K 1/024; H05K 3/426; H05K 3/0094
See application file for complete search history.

(56) References Cited

U.S. PATENT DOCUMENTS

| | | |
|---|---|---|
| 2004/0038515 A1 | 2/2004 | Siegel et al. |
| 2005/0285234 A1 | 12/2005 | Kanno |
| 2008/0225378 A1 | 9/2008 | Weikert et al. |
| 2012/0331429 A1 | 12/2012 | Chun et al. |
| 2013/0009322 A1 | 1/2013 | Conn et al. |
| 2013/0264720 A1 | 10/2013 | Chun et al. |
| 2015/0257282 A1 | 9/2015 | We et al. |
| 2016/0351473 A1* | 12/2016 | Uchida ................... H01L 24/03 |
| 2019/0355681 A1 | 11/2019 | Kong et al. |

OTHER PUBLICATIONS

"Malaysia Application Serial No. 2016704903, Response filed Apr. 8, 2022Substantive Examination Adverse Report dated Feb. 10, 2022", W English translation, 36 pgs.
"U.S. Appl. No. 16/473,962, Examiner Interview Summary dated Mar. 29, 2021", 2 pgs.
"U.S. Appl. No. 16/473,962, Final Office Action dated Apr. 1, 2021", 12 pgs.
"U.S. Appl. No. 16/473,962, Non Final Office Action dated Feb. 12, 2021", 12 pgs.
"U.S. Appl. No. 16/473,962, Non Final Office Action dated Dec. 24, 2020", 16 pgs.
"U.S. Appl. No. 16/473,962, Notice of Allowance dated Jul. 2, 2021", 13 pgs.
"U.S. Appl. No. 16/473,962, Preliminary Amendment filed Jun. 26, 2019", 7 pgs.
"U.S. Appl. No. 16/473,962, Response filed Mar. 17, 2021 to Non Final Office Action (dated Feb. 12, 2021", 9 pgs.
"U.S. Appl. No. 16/473,962, Response filed May 20, 2021 to Final Office Action dated Apr. 1, 2021", 7 pgs
"U.S. Appl. No. 16/473,962, Response filed Aug. 24, 2020 to Restriction Requirement (dated Jul. 9, 2020", 7 pgs.
"U.S. Appl. No. 16/473,962, Restriction Requirement dated Jul. 9, 2020", 7 pgs.
"International Application Serial No. PCT/US2017/067366, International Search Report dated Apr. 17, 2018", 3 pgs.
"International Application Serial No. PCT/US2017/067366, Written Opinion dated Apr. 17, 2018", 7 pgs.

* cited by examiner

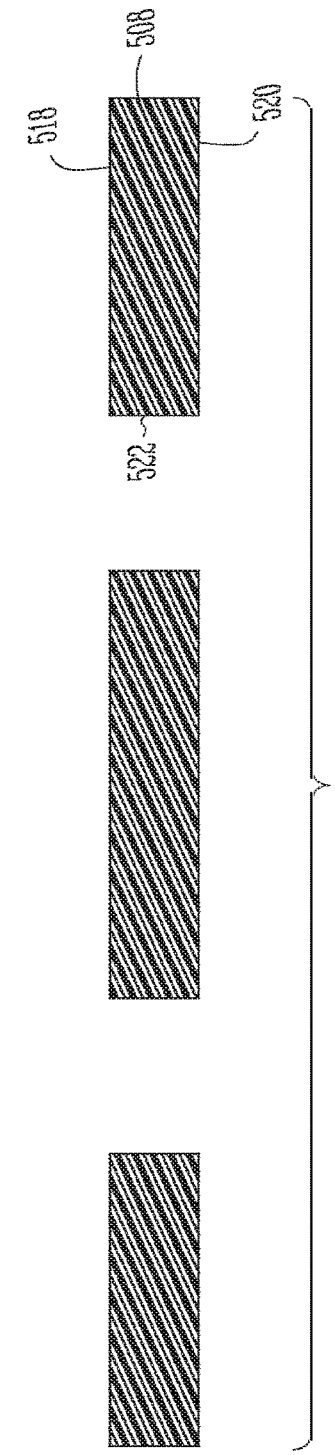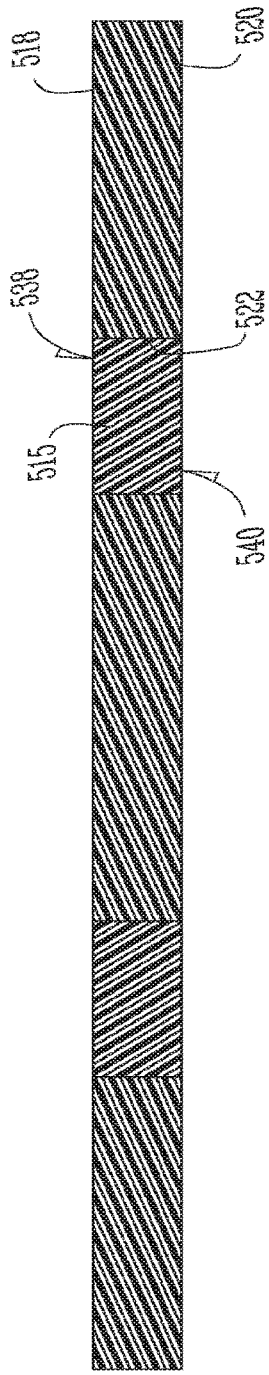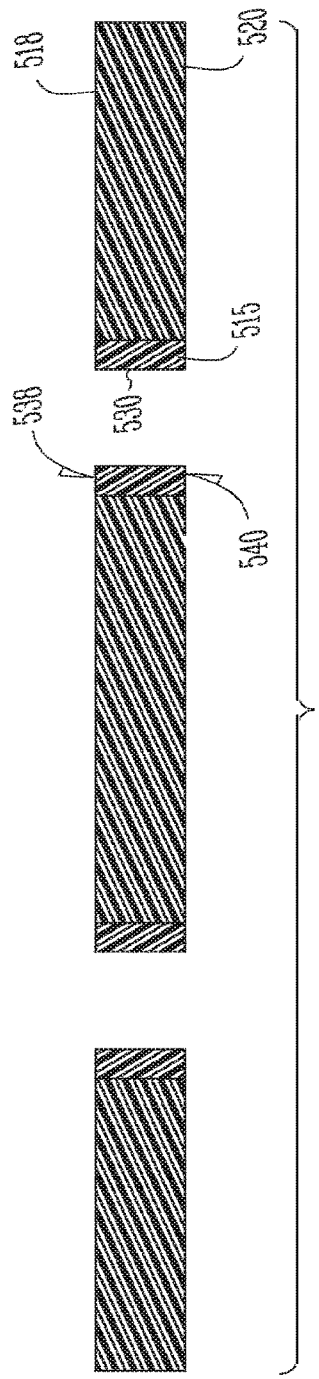

SUBSTRATE WITH GRADIATED DIELECTRIC FOR REDUCING IMPEDANCE MISMATCH

PRIORITY APPLICATION

This application is a continuation of U.S. patent application Ser. No. 16/473,962, filed Jun. 26, 2019, which is a U.S. National Stage Filing under U.S.C. 371 from International Application No. PCT/US2017/067366, filed Dec. 19, 2017, which claims the benefit of priority to Malaysian Application Serial No. PI 2016704903, filed Dec. 30, 2016, each of which is incorporated herein by reference in its entirety.

TECHNICAL FIELD

This document pertains generally, but not by way of limitation, to electronic circuits, such as high-frequency electronic circuits.

BACKGROUND

Existing electronic circuit assemblies, such as microchip packages or printed circuit board assemblies, often include vias to communicate electrical signals between various copper layers of the microchip package or circuit board. For instance, a circuit board may include a single layer construction or a multi-layer construction. For single layer circuit boards, a dielectric layer may be laminated with layers of copper on opposing sides of the dielectric layer. Multi-layer circuit boards can include additional dielectric layers and copper layers. For instance, multi-layer circuit boards can include alternating dielectric layers and copper layers. The copper layers (e.g. routing traces) of the circuit board can be electrically coupled with one or more of the vias to communicate electrical signals between the circuits of the various copper layers. For instance, vias often include a conductive interconnection passing through one or more dielectric layers. The via, e.g. plated through-hole (PTH) via, can include a different impedance than the copper layers at a location where the copper layers are electrically coupled to the via. Thus, an impedance mismatch can be created between the via and the copper layers. Impedance mismatch can increase signal reflection (e.g., reflection coefficient), electrical losses, or result in standing waves within the electronic circuit. There is a general need for devices, systems and methods to address impedance mismatch in electronic circuits.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
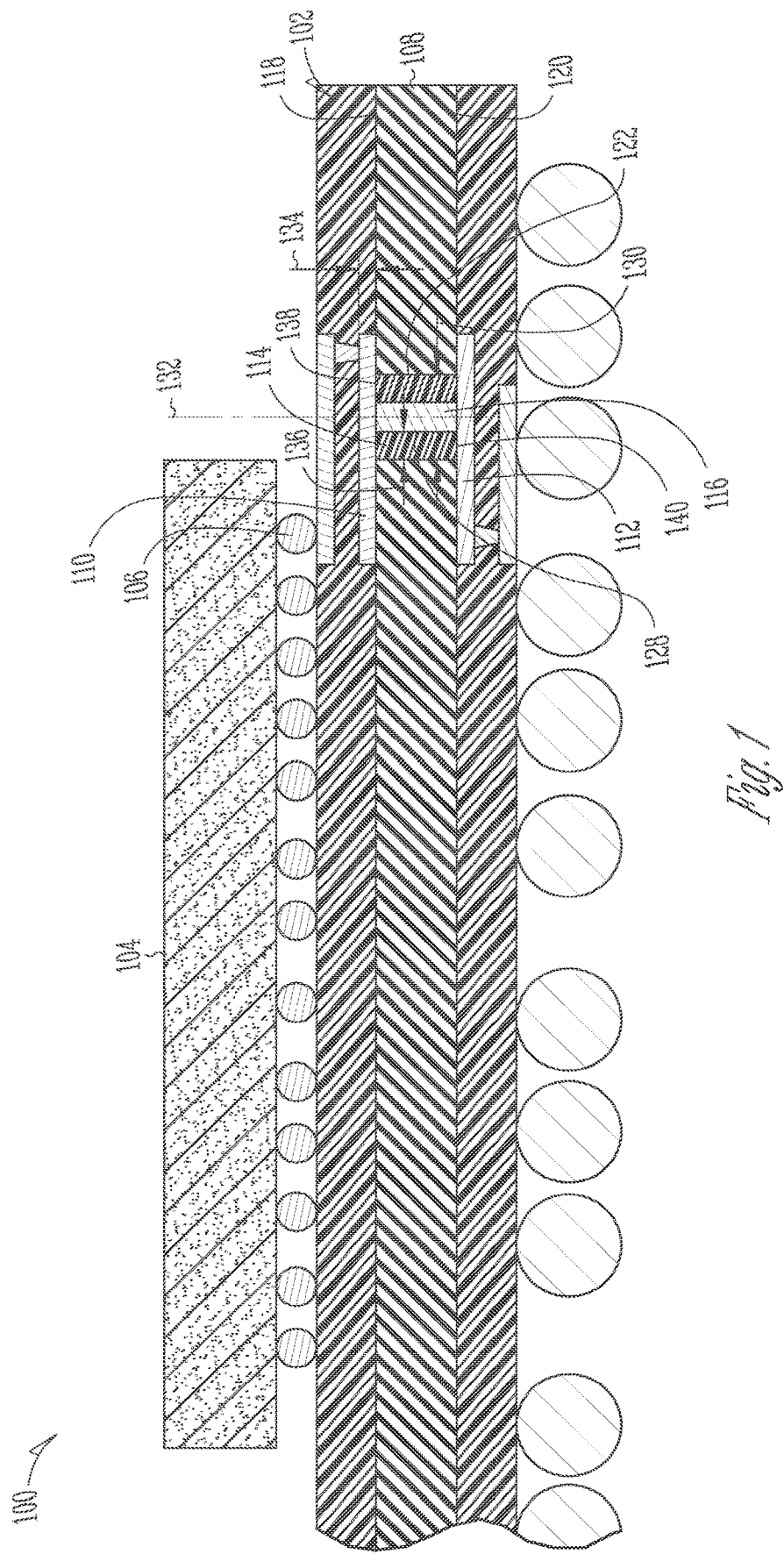
FIG. 1 illustrates an example of a cross section of an electronic package, according to an embodiment.

The present application relates to devices and techniques for an electronic circuit including a substrate having a gradiated dielectric characteristic, such as a substrate including one or more intermediate materials. The substrate can include a first dielectric characteristic and the intermediary material can include a second dielectric characteristic. The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The present inventors have recognized, among other things, that a problem to be solved can include reducing impedance mismatch in electronic circuits, such as electrical impedance across a via located through a substrate. In some examples, impedance mismatch within an electrical circuit can reduce signal integrity between a transmitter and a receiver within the electrical circuit. For instance, impedance mismatch can increase signal reflection (e.g., reflection coefficient), provide standing waves, or increase electrical losses. In an example, an impedance mismatch of 100 can result in a system margin reduction of up to 20% or more.

Geometry of conductive elements within the electronic circuit can affect the impedance mismatch in the electrical circuit. For instance, the electronic circuit can include various conductive sections. One section of the circuit can have a different impedance than another section of the circuit based on the respective geometries of the various sections. In an example, the various sections can include different cross sections, and some sections can be oriented perpendicular to other sections. For instance, a first section can include a first cross-sectional area (e.g., transverse to a longitudinal direction of the conductive element), and a second conductive element can include a second cross sectional area. The transition from the first section to the second section can produce an impedance mismatch as a result of the difference in cross-sectional area. To mitigate impedance mismatch in electronic circuits, a ground plane near the conductive element can be spaced at a distance from the conductive element (e.g., ground plane voiding). This distance can be configured to isolate the conductive element from the ground plane, but can result in increased package sizes and cost.

The present subject matter can provide a solution to this problem, such as by providing an electrical circuit including a substrate with an intermediary material disposed therein. The substrate can include a first dielectric characteristic, such as a first dielectric constant. The intermediary material can include a second dielectric characteristic, such as a second dielectric characteristic that is different than the first dielectric characteristic. For example, the second dielectric characteristic can be lower than the first dielectric characteristic. Accordingly, the substrate can include a gradiated dielectric characteristic. The substrate can include a first side and a second side. The intermediary material can be disposed within the substrate, for instance, between the first side and the second side of the substrate. A first conductive layer can be disposed on the first side, and a second conductive layer disposed on the second side. A conductive path can be electrically coupled between the first conductive layer and the second conductive layer. The conductive path can be in contact with at least a portion of the intermediary material.

The gradiated dielectric characteristic of the substrate (e.g., based on the intermediary material) can lower the capacitance between the first conductive layer on the first side of the substrate and the second conductive layer on the second side of the substrate. The impedance through the conductive path can be increased corresponding to the decrease in capacitance. Where the first conductive layer and the second conductive layer include a cross sectional area (e.g., transverse to the direction of signal propagation as previously described) that is smaller than the cross-sectional area of the conductive path, the impedance mismatch between the conductive layer (e.g., first conductive layer or second conductive layer) and the conductive path can be decreased.

FIG. 1 illustrates an example of a cross section of an electronic package 100, according to an embodiment. As shown in FIG. 1, the electronic package 100 can include an electronic circuit 102, a die 104, and an interconnect 106 (e.g., solder bump) electrically coupling the electronic circuit 102 with the die 104. The electronic package 100 can include, but is not limited to, a processor (e.g., central processing unit (CPU), graphical processing unit (GPU), or the like), microcontroller (MCU), system-on-chip (SOC), application specific integrated circuit (ASIC), field programmable gate array (FPGA), or other logic or memory package. The electronic circuit 102 can include a substrate 108, one or more conductive layers (such as a conductive layer 110 or a conductive layer 112), at least one intermediary material 114, and a conductive path 116. For instance, in the example of FIG. 1, the first conductive layer 110 can be attached to a first side 118 of the substrate 108. The second conductive layer 112 can be attached to a second side 120 of the substrate 108. The conductive path 116 can be electrically coupled between the first conductive layer 110 and the second conductive layer 112. The intermediary material 114 can be disposed within the substrate 108. For instance, as shown in FIG. 1, the intermediary material 114 can be located within a hole in the substrate 108, such as bore 122. For instance, the bore 122 can extend from the first side 118 to the second side 120. The die 104 can be electrically coupled to at least one of the conductive layers, such as conductive layer 110 or conductive layer 112. For instance, the die 104 can include at least one interconnect 106, such as a lead-free solder bumps, controlled collapse chip connection (C4) bumps, surface mount pad, or the like. At least one contact of the die 104 can be electrically coupled to the first conductive layer 110 or the second conductive layer 112.

The substrate 108 can be an insulator for electrically isolating and supporting one or more electrical circuits of the electronic package 100. As shown in the example of FIG. 1, the substrate 108 can be a dielectric layer or a semi-conductive layer. As previously discussed, the substrate 108 can include the first side 118 and the second side 120. The substrate 108 can be included in a printed circuit board, flexible circuit, interposer, of the like. In the example of FIG. 1, the substrate 108 can be a core of a printed circuit board, such as a core of an integrated circuit (IC) package. In various examples, the substrate 108 can be constructed of a material, including but not limited to, polyimide, prepreg, glass, epoxy, FR4 (glass-reinforced epoxy laminate), glass-cloth, glass-fiber, polymer-fiber composite, cotton paper composite, ceramic, or the like. In a further example, the substrate 108 can be fabricated from silicon, such as a silicon wafer. The substrate 108 includes a dielectric characteristic (e.g., a first dielectric characteristic). The dielectric characteristic can include a permeability, relative permittivity, dielectric constant, or the like. In an example, the substrate can be constructed from FR4 and include a dielectric constant between 3.8 and 4.7.

The conductive layer, such as the first conductive layer 110 or the second conductive layer 112, can be disposed on the first side 118 of the substrate 108, the second side 120 of the substrate 108, both sides of the substrate 108, or the intermediary material 114. The conductive layer can communicate electrical signals within the electronic circuit 102. For instance, the conductive layer can be configured as a signal routing conductor (e.g., trace) along the substrate 108. The conductive layer can be constructed from a material, including but not limited to copper, graphite, nickel, silver, gold, or the like. In an example, the conductive layer can include a thickness between 1 μm and 20 μm. For instance, the conductive layer can include a thickness of 10 μm. A width of the conductive layer can include, but is not limited to 5 to 70 μm or between 9 and 20 μm.

In various examples, the conductive layer can be attached to the substrate 108 or the intermediary material 114 by an adhesive, such as pressure activated adhesive, thermally activated adhesive, or the like. In a further example, the conductive layer can be laminated to the substrate 108 or the intermediary material 114 by pressure, heat, or a combination thereof. For instance, the conductive layer can include a conductive sheet, such as a metallic foil (e.g., copper foil) attached to the substrate 108 or the intermediary material 114 with adhesive or by lamination. In some examples, the conductive layer can be deposited on the substrate 108 or the intermediary material 114. For instance, the conductive layer can be plated on to the substrate, such as by an electroplating process (e.g. electroless or electrolytic plating). In other examples, the conductive layer can be attached to the substrate by vapor deposition, chemical deposition, evaporative deposition, sputtering, or the like. In various examples, the conductive layer can be etched to remove portions of the conductive layer to form the circuit routing (e.g., traces). In other examples, the conductive layer can be disposed on to the substrate 108 or intermediary material 114 by an additive or subtractive process. For instance, the conductive layer can include a conductive ink printed on to the substrate 108 or intermediary layer 114.

In some examples, the substrate can include a multi-layer construction. For instance, the substrate can include a plurality of dielectric layers or conductive layers. In various examples, the conductive layer, such as conductive layer 110 or conductive layer 112 can be located on opposing sides of an interior dielectric layer, located on exterior layers, or located with one or more dielectric layers or conductive layers positioned therebetween.

As shown in the example of FIG. 1, the conductive path 116 can be electrically coupled between the first conductive layer 110 and the second conductive layer 112. The conductive path 116 can communicate electrical signals from the first side 118 of the substrate 108 to the second side 120 of the substrate 108. For instance, the conductive path 116 can be oriented transverse to one or more of the conductive layers, such as conductive layer 110 or conductive layer 112. In an example, the conductive path 116 can be a plated through-hole (e.g., a metalized via through a hole, such as a hole 128) in the intermediary material 114. For instance, the conductive path 116 can be plated on to a side surface of the hole 128, such as by electroplating (e.g. electroless or electrolytic plating), chemical vapor deposition, vacuum deposition, sputtering, evaporative deposition, or the like. The plated conductive path can include a thickness between 1 and 300 μm, for instance 10-20 μm. The conductive path 116 can include a solid or hollow cross section transverse to a longitudinal axis 132 of the conductive path 116. Where the conductive path 116 includes a hollow cross section, the conductive path 116 can include a filler disposed within a lumen of the conductive path 116. The filler can provide mechanical support for additional conductive or dielectric layers, such as additional buildup layers laminated or attached to the substrate 108 or conductive layer. In various examples, the filler can include a conductive or non-conductive material including, but not limited to, epoxy, conductive epoxy, copper, solder, or the like. For instance, the conductive filler can be electroplated onto the conductive path 116 to fill the lumen. Accordingly, the conductive path 116 can include a solid cross section between the first side 118 and the second side 120 of the substrate 108.

In some examples, the conductive path 116 can be electrically coupled between conductive layers separated by more than one dielectric layer. For instance, the first conductive layer 110 can be disposed on a first dielectric layer and the second conductive layer 112 can be disposed on a second dielectric layer. The conducive path 116 can be located through the first and second dielectric layers. For instance, in various examples, the conductive path can electrically connect any two or more conductive layers of the electronic package 100.

In an example, the conductive path 116 can include a dimension 130. The dimension 130 can be transverse to the longitudinal axis 132 of the conductive path, the dimension being 200 μm or less. The dimension 130 can be between 1 and 400 μm. For instance, in an example, the dimension 130 can be 200 μm or less. The dimension 130 can be greater than a dimension (e.g., thickness) of the conductive layer along the longitudinal axis 132 of the conductive path 116. In various examples, the conductive path 116 can communicate high-frequency electrical signals, such as 100 MHz or greater, for instance, 5 gigabits per second (Gbps) to 100 Gbps, or between 10 Gbps and 56 Gbps.

Impedance within a circuit, such as the electronic circuit 102 can be dependent on signal frequency and the geometry of the conductive element, such as the conductive layer or the conductive path 116. In an example, as the cross-sectional area of a conductive element decreases, the impedance within the conductive element increases correspondingly. In a further example, an increase in the frequency of the electrical signal can decrease the impedance in a conductive element and can increase the effects of an impedance mismatch within the electronic circuit 102. The conductive layer can include a relatively small cross-sectional area (e.g., along a direction of signal propagation) compared to the cross-sectional area of the conductive path 116 (e.g., transverse to the longitudinal axis 132). For instance, a dimension 134 of the conductive layer (e.g., thickness and width of the conductive traces) can be smaller than the dimension 130. Accordingly, an impedance mismatch can exist between the conductive path 116 and one or more conductive layers, such as the conductive layer 110 or conductive layer 112.

As previously stated, the intermediary material 114 can be disposed within the substrate 108. For instance, as shown in the example of FIG. 1, the intermediary material 114 can be located in the substrate 108, such as between the first side 118 and the second side 120 or from the first side 118 to the second side 120. In an example, the intermediary material 114 can be disposed within the bore 122 in the substrate 108. As shown in the example of FIG. 1, the bore 122 can extend from the first side 118 to the second side 120. The intermediary material 114 can be in contact with at least a portion of the conductive path 116. For instance, the intermediary material 114 can be adjacent to the conductive path 116. In various examples, the intermediary material 114 can surround or at least partially surround the conductive path 116. In the example of FIG. 1, the intermediary material 114 can surround the conductive path 116. For instance, in an example, the conductive path 116 can extend through at least a portion of the intermediary material 114. In a further example, the intermediary material 114 can be a sleeve around the conductive path 116. For instance, the hole 128 can be located through the intermediary material 114. The hole 128 can extend from a first surface 138 of the intermediary material 114 to a second surface 140 of the intermediary material 114. As previously discussed, the conductive path 116 can be located through the hole 128. In an example, the intermediary material 114 can include a dimension 136 (e.g., an intermediary material dimension). The dimension 136 can be measured between the conductive path 116 and the substrate 108. In various examples, the dimension 136, can include, but is not limited to, between 20 μm, 50 μm, or any dimension therebetween.

The intermediary material 114 can include a dielectric characteristic (e.g., second dielectric characteristic) that is different than the dielectric characteristic of the substrate 108 (e.g., first dielectric characteristic). For instance, the dielectric characteristic of the intermediary material 114 can be lower than the dielectric characteristic of the substrate 108. The intermediary material 114 can include a dielectric characteristic, such as a second dielectric characteristic, including, but not limited to, a dielectric constant between 4 and 1. For example, the intermediary material 114 can include a dielectric constant of 3.5, 3, 2.5, 2, 1.5, or the like. In an example, the dielectric characteristic of the substrate 108 can include a dielectric constant of 4. Correspondingly, the dielectric constant of the intermediary material can be lower than 4, such as 3.5 or less. Accordingly, a gradiated dielectric characteristic (e.g., dielectric constant) can be provided within the substrate 108 and at least partially surrounding the conductive path 116. The intermediary material 114 can include, but is not limited to, polytetrafluoroethylene, polyethylene, polypropylene, polystyrene, carbon disulfide, polyimide, silicon dioxide, bismaleimide triazine, or other.

Impedance within the conductive path 116 can function similarly to a capacitor, for example, a voltage differential can exist between the conductive path 116 and adjacent conductive path(s) associated to a reference voltage (e.g. Vss or ground), with the substrate 108 being a dielectric material therebetween. For a capacitor, the impedance can be inversely proportional to the frequency of the electrical signal on one or more sides of the dielectric material, such as a frequency of the signal in the conductive path 116 and adjacent conductive path(s) associated to a reference voltage (e.g. Vss or ground).

The subject matter of the present application can reduce the impedance mismatch between the conductive path 116 and one or more conductive layers, such as conductive layer 110 or conductive layer 112. For instance, where the dielectric constant of the intermediary material 114 is lower than the dielectric constant of the substrate 108, the capacitance between the conductive path 116 and adjacent conductive path(s) associated to a reference voltage (e.g. Vss or ground) can be reduced. By reducing the capacitance of the material (e.g., the intermediary material 114) in the proximity (e.g., at least partially surrounding) the conductive path 116, the impedance of the conductive path 116 can be increased. Accordingly, the impedance of the conductive path 116 can be closer to the impedance of the first conductive layer 110 or the second conductive layer 112. In some examples, decreasing the impedance mismatch between the conductive path 116 and the conductive layers, such as the first conductive layer 110 or the second conductive layer 112, can reduce reflection of electrical signals, reduce electrical losses, or reduce standing waves within the conductive path. Consequently, system margin can be increased due to improved signal integrity (e.g., decreased electrical losses), package size can be decreased, or any combination thereof.

Figure 2:
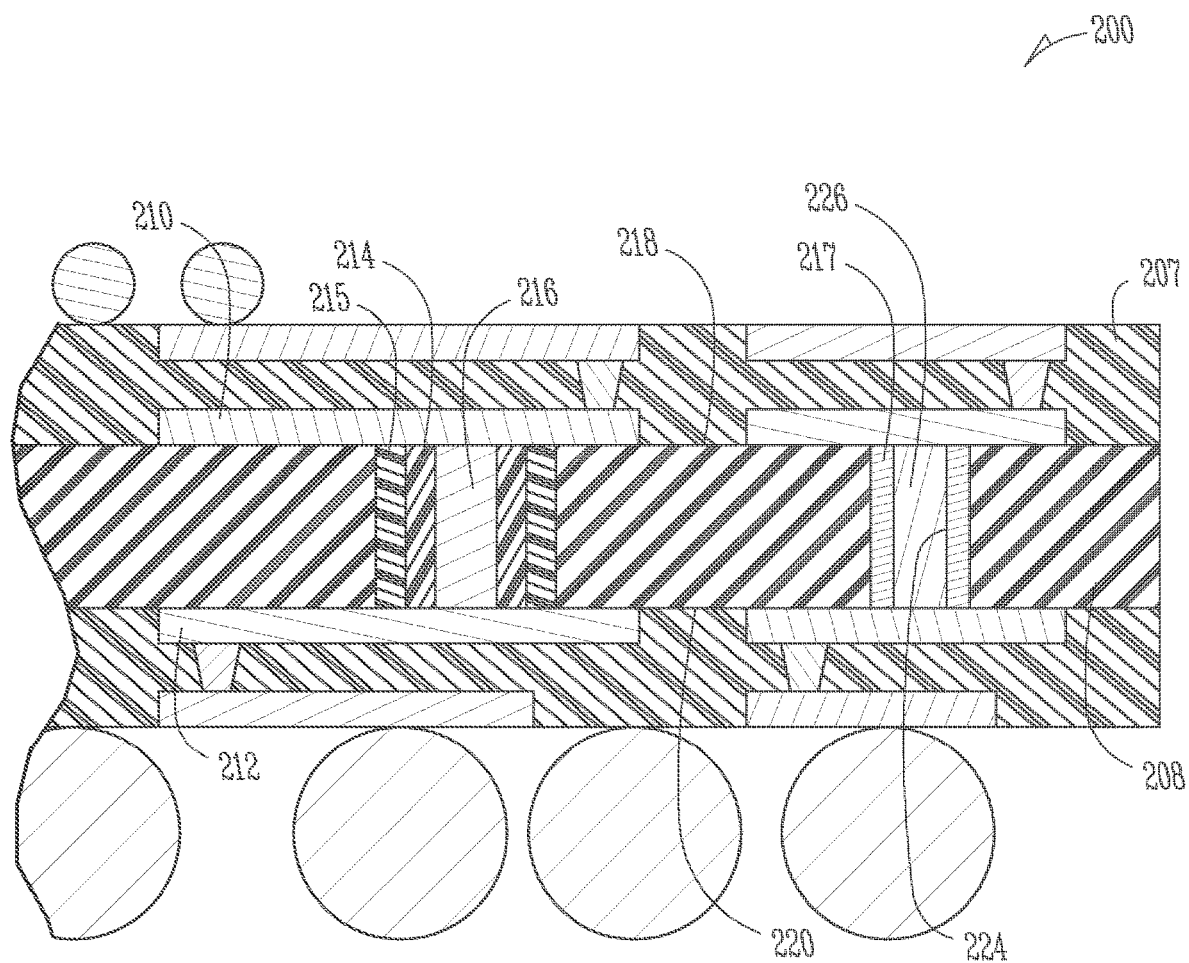
FIG. 2 is an example, of a cross section of an electronic circuit including two or more intermediary materials disposed within a substrate, according to an embodiment.

FIG. 2 is an example, of a cross section of an electronic circuit 200 including two or more intermediary materials disposed within a substrate, such as a substrate 208, according to an embodiment. For instance, the electronic circuit 200 can include an intermediary material 214 (referred to herein as a first intermediary material) and an intermediary material 215 (referred to herein as a second intermediary material) disposed within the substrate 208. In an example, the first intermediary material 214 can include the intermediary material 114 as previously described herein. In the example of FIG. 2, the second intermediary material 215 can be disposed within the substrate 208. For instance, the second intermediary material 215 can be located between the first intermediary material 214 and the substrate 208. In an example, the second intermediary material 215 can include a dimension between the first intermediary material 214 and the substrate 208 between 20 to 50 μm or between 30 to 50 μm.

The second intermediary material 215 can include, but is not limited to, polytetrafluoroethylene, polyethylene, polypropylene, polystyrene, carbon disulfide, polyimide, silicon dioxide, bismaleimide triazine, or other. In various examples, the second intermediary material 215 can include a dielectric characteristic, such as a third dielectric characteristic. The third dielectric characteristic can include a dielectric characteristic value between the first dielectric characteristic and the second dielectric characteristic. For instance, the third dielectric characteristic can include, but is not limited to, a dielectric constant between 4 and 1. In some examples, the third dielectric characteristic can include a dielectric constant of 3, 2.5, 2, 1.5, or the like. In an example, the third dielectric characteristic can include a dielectric constant less than 2.5. Including the second intermediate material 215 between the first dielectric material 214 and the substrate 208 can further reduce the impedance mismatch between the conductive path, such as conductive path 216, and the first conductive layer (e.g., conductive layer 210) or the second conductive layer (e.g., conductive layer 212) while mitigating undesirable effects of the substrate 208 having a low dielectric constant throughout. In other words, the impedance increasing effect of the low dielectric characteristic of the first intermediary material or the second intermediary material is localized to an area around the conductive path 216. In an example, the first intermediary material 214 (e.g., closest to the conductive path) may contribute to 80% of the impedance increase in the conductive path 216. In various examples, any dielectric layer or semi-conductive layer within an electronic circuit, such as the electronic circuit 102 or electronic circuit 200, can include one or more intermediary materials in contact with at least a portion of the conductive path 216. For instance, where the electronic circuit 200 includes a dielectric layer, such as a dielectric layer 207 as shown in the example of FIG. 2, attached to a first side or a second side of the substrate 208, such as first side 218 or second side 220, the dielectric layer 207 can include at least one intermediary material as previously described.

As shown in the example of FIG. 2, the conductive path, such as conductive path 217, can include a filler. The filler, such as filler 226, can be disposed in a lumen 224 of the conductive path 217. The lumen 224 can be formed during the fabrication of the conductive path 217. For instance, where the conductive path 217 is formed by electroplating (e.g. electroless or electrolytic plating) a hole in the intermediary material 214, the conductive path 217 can be a thin layer of material located on a side wall of the hole. In a further example, the lumen 224 can be formed within the conductive path 217, for instance, drilled within the conductive path 217. In some examples, the filler 226 can be disposed within the lumen 224 by electroplating, vapor deposition, chemical deposition, evaporative deposition, sputtering, or the like. In further examples, the filler 226 can be disposed in the lumen 224 in liquid form. For instance, the filler 226 can be dispensed from a syringe or a pump. In an example, a squeegee can direct the filler 226 into the lumen 224. The filler 226 can be a material including, but not limited to, epoxy, conductive epoxy, copper, silver, gold, graphite, tin, or other conductive or non-conductive material. Accordingly, the filler 226 can fill a void in the lumen 224 to provide support for the conductive path 217 or a dielectric layer, such as dielectric layer 207, disposed on the substrate 208.

Figure 3:
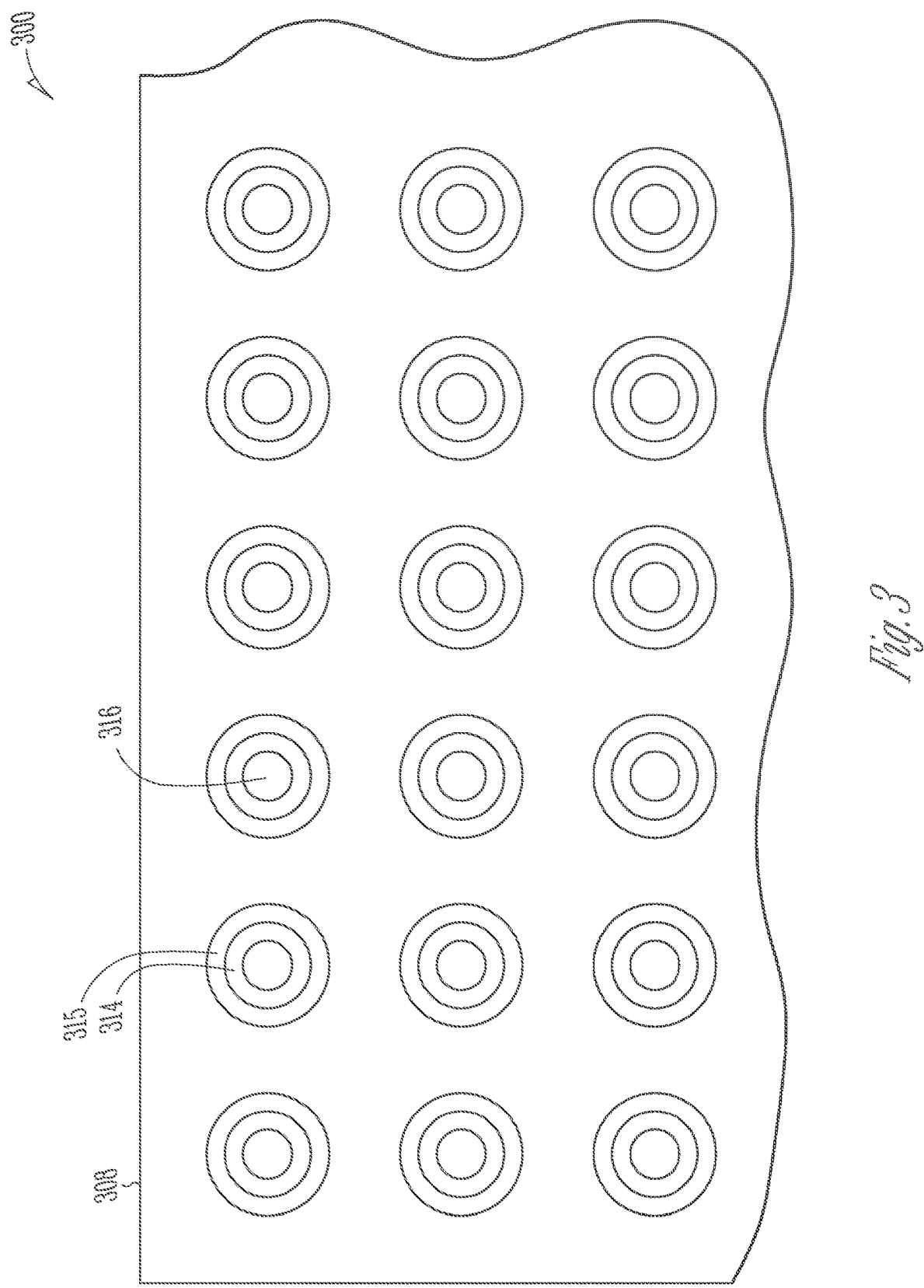
FIG. 3 illustrates an example of a substrate including a plurality of intermediary materials disposed therein, according to an embodiment.

FIG. 3 illustrates an example of a gradiated substrate, such as a universal gradiated substrate 300 including a plurality of intermediary materials disposed therein, according to an embodiment. For instance, the universal gradiated substrate 300 can include a generic configuration for use in one or more electronic circuits. As shown in the example of FIG. 3, the universal gradiated substrate 300 can include a plurality of locations along a substrate 308 where the intermediary material, such as the intermediary material 314 (e.g., the first intermediary material) or the intermediary material 315 (e.g., the second intermediary material) can be disposed. For instance, the locations can be dispersed along the substrate 308, such as in a grid pattern as shown in FIG. 3. In other examples, the positions can be arranged in other patterns or arrangements. In an example, the intermediary material 314 and the intermediary material 315 can be disposed in the substrate 308 as previously described herein. In a further example, three or more intermediary materials can be disposed within the substrate 308. For instance, the three or more intermediary materials can be concentrically positioned. The center-most intermediary material having the lowest dielectric characteristic, and the outer-most intermediary material having the highest dielectric characteristic of the intermediary materials. In an example, each of the intermediary materials can include a dielectric characteristic that is lower than the dielectric characteristic of the substrate 308. In a further example, the dielectric characteristic of one or more of the intermediary materials can be gradiated. For instance, the dielectric constant of the intermediary material can include a higher value at one side of the intermediary material (e.g., an outer side) and a lower dielectric characteristic at another side of the intermediary material (e.g., an inner side).

A conductive path, such as conductive path 316 can be formed through one or more of the intermediary materials, such as the intermediary material 314 or the intermediary material 315, as previously described herein. In some examples, some of the intermediary material positions can be unused. For instance, no conductive path will be formed through some of the intermediary material positions. Accordingly, forming a plurality of intermediary material positions on the universal gradiated substrate 300 can provide a generic substrate configuration for a variety of electronic circuits. The universal gradiated substrate 300 can, for example, cut down on manufacturing or inventory cost. In another example, the universal gradiated substrate 300 can be sold independently of the electronic circuit or device, for instance, as a piece part in other assemblies.

Figure 4:
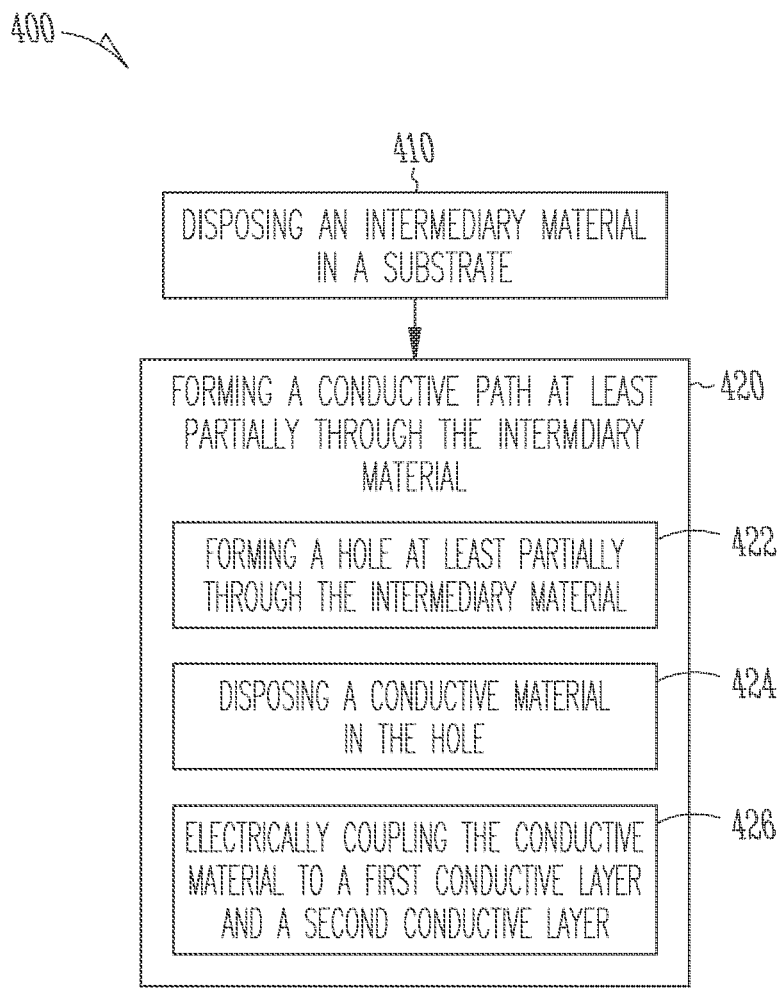
FIG. 4 is block diagram of an exemplary technique for making an electronic circuit, according to an embodiment.

FIG. 4 is block diagram of an exemplary technique for making an electronic circuit including a substrate having a gradiated dielectric characteristic, such as an electrical circuit including an increased impedance via previously described in the examples herein and shown for instance in FIGS. 1-3. In describing the method 400, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the method 400 include, but are not limited to, the corresponding numbered elements provided herein. Other corresponding features described herein (both numbered and unnumbered) as well as their equivalents are also considered.

At 410, an intermediary material (e.g., intermediary material 114, 214, or 314) can be disposed in a substrate, such as the substrate 108, 208, or 308. For instance, in an example, the intermediary material can be disposed in substrate of an electronic package (e.g., electronic package 100). The intermediary material can be located between a first side and a second side of the substrate. The substrate can include a first dielectric characteristic and the intermediary material can include a second dielectric characteristic. The second dielectric characteristic can be different than the first dielectric characteristic. In an example, the intermediary material can be disposed in a silicon substrate. For instance, the substrate can be a silicon wafer or a silicon bridge. In a further example, the intermediary material can be disposed in the substrate by forming a bore in the substrate from the first side to the second side of the substrate. Subsequently, the bore can be filled with the intermediary material. In various examples, the intermediary material can be located at the first side, the second side, or anywhere in between. For instance, in an example, the intermediary material can be located from the first side to the second side. The intermediary material can include a first surface that is substantially co-planar with the first side and a second surface that is substantially co-planar with the second side. In an example, the intermediary material can be disposed in the substrate in a liquid state. After being disposed into the substrate, the intermediary material can include a solid state. For instance, the intermediary material can cure after being disposed into the substrate. In various examples, the intermediary material can have a dielectric characteristic less than the first dielectric characteristic. For instance, the intermediary material can have a dielectric characteristic, such as the second dielectric characteristic, that is a dielectric constant less than 2.5. In an example, the intermediary material can have a gradiated dielectric characteristic between a conductive path, such as conductive path 116 or 216, and the substrate.

In some examples, the intermediary material can include a first intermediary material and a second intermediary material. For instance, the second intermediary material can include a third dielectric characteristic. The third dielectric characteristic can include a value between the first dielectric characteristic and the second dielectric characteristic. In an example, a hole can be formed in the intermediary material (e.g., a second intermediary material). The first intermediary material can be disposed in the hole of the second intermediary material. In a further example, the third dielectric characteristic can include a dielectric constant less than 3.5.

At 420, a conductive path can be formed at least partially through the intermediary material. Forming the conductive path at least partially through the intermediary material can include any one, or all, of steps 422 through 426.

At 422, a hole, such as hole 128, can be formed at least partially through the intermediary material. For instance, the hole can extend through the substrate as previously described. In various examples, the hole can be formed by a process including, but not limited to, mechanical drilling, laser drilling, water jet cutting, die cutting, or other process. The hole can have an axis that is substantially transverse to the first side of the substrate or the second side of the substrate. Forming the hole can include forming the hole through the intermediary material. For instance, the hole can be formed from a first surface of the intermediary material to a second surface of the intermediary material. The first surface can be substantially co-planar with the first side, and the second surface can be substantially co-planar with the second side. In an example, the hole can be surrounded by the intermediary material. In some examples, the hole can have a dimension between a side wall of the hole and the substrate including, but not limited to 20 μm, 50 μm, or any dimension therebetween.

Where the substrate includes the first intermediary material and the second intermediary material, a second hole can be formed in the second intermediary material as previously described. The first intermediary material can be deposited in the second hole. Forming the second hole in the second intermediary material can include forming the second hole having a dimension between a side surface of the second hole and the hole in the first intermediary material including, but not limited to, 20 μm, 50 μm, or any dimension therebetween.

At 424, a conductive material can be disposed in the hole to form a conductive path, such as conductive path 116, 216, or 316. In various examples, disposing the conductive material in the hole can include, but is not limited to, disposing the conductive material onto the side surface of the hole by vapor deposition, chemical deposition, evaporative deposition, sputtering, electroplating (e.g. electroless or electrolytic plating), or other process. In a further example, where the first intermediary material and the second intermediary material are disposed within the substrate, the conductive material can be disposed in the hole formed in the first intermediary material.

At 426, the conductive material can be electrically coupled to a first conductive layer (e.g., conductive layer 110) and a second conductive layer (e.g., conductive layer 112). In an example, the first conductive layer can be attached to the first side of the substrate and the second conductive layer can be attached to the second side of the substrate. In a further example, the conductive layer, such as the first conductive layer or the second conductive layer, can include a conductive sheet. The conductive sheet can be attached to the substrate. For instance, the conductive sheet can be laminated on to the substrate, such as by hot-press lamination to bond the conductive layer to the substrate. In various examples, the conductive layer can be attached to the substrate by adhesive, such as pressure activated adhesive, thermally activated adhesive, or the like. In some examples, the conductive layer can be deposited on the substrate. For instance, the conductive layer can be plated on to the substrate, such as by electroplating (e.g. electroless or electrolytic plating). In other examples, the conductive layer can be attached to the substrate by vapor deposition, chemical deposition, evaporative deposition, sputtering, or the like. In an example, the conductive layer can include a trace, a contact pad, such as a conductor in an electronic circuit, such as electronic circuit 102 or 202. In a further example, the conductive layer can be etched or selectively deposited to form a circuit pattern (e.g., layout) along the substrate. In an example, the conductive material can be disposed within the hole to form the conductive path can form an electrical coupling between the first conductive layer and the second conductive layer. In some examples, the conductive layers can be separated by more than one dielectric layer. For instance, where the substrate includes a multi-layer construction.

In various examples, the conductive path can include a cross sectional area that is two times or more than the cross-sectional area of the first conductive layer or the second conductive layer. For instance, the cross section of the conductive path can be transverse to a longitudinal axis of the conductive path. The cross-sectional area of the first conductive layer or the second conductive layer can be along a longitudinal axis of the first conductive layer or a second conductive layer. In an example, the cross section of the first conductive layer or the second conductive layer can be proximate to a junction with the conductive path. For instance, the junction can be at the location of the electrical coupling between the conductive path and the first conductive layer or between the conductive path and the second conductive layer.

In a further example, a lumen (e.g., lumen 224) of the conductive path can be filled with a filler (e.g., filler 226). For instance, the filler can include a conductive filler or a non-conductive filler as previously discussed. In an example, the filler can be deposited into the lumen in liquid form. For instance, the filler can be deposited into the lumen by a syringe or a pump. In an example, a squeegee can direct the filler into the lumen. In further examples, the filler can be disposed within the lumen by electroplating, vapor deposition, chemical deposition, evaporative deposition, sputtering, or the like.

FIGS. 5A-F depict an example of a process of making an electronic circuit 502 (e.g., shown in FIG. 5F) including a substrate having a gradiated dielectric characteristic, such as an electrical circuit including an increased impedance via previously described in the examples herein and shown for instance in FIGS. 1-4. In describing the method 500, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the method 500 include, but are not limited to, the corresponding numbered elements provided herein. Other corresponding features described herein (both numbered and unnumbered) as well as their equivalents are also considered.

FIG. 5A illustrates an example of a substrate, such as substrate 508. The substrate 508 can include a first side 518 and a second side 520. The substrate 508 can include a first dielectric characteristic as previously described herein. The substrate 508 can include a bore, such as bore 522. The bore 522 can be formed, such as mechanically drilled, laser drilled, or formed by another process as previously described herein. In other examples, the substrate 508 can include a copper clan laminate. For instance, a first conductive layer 510 can be disposed on the first side 518 and a second conductive layer 512 can be disposed on the second side 520.

Figure 5D:
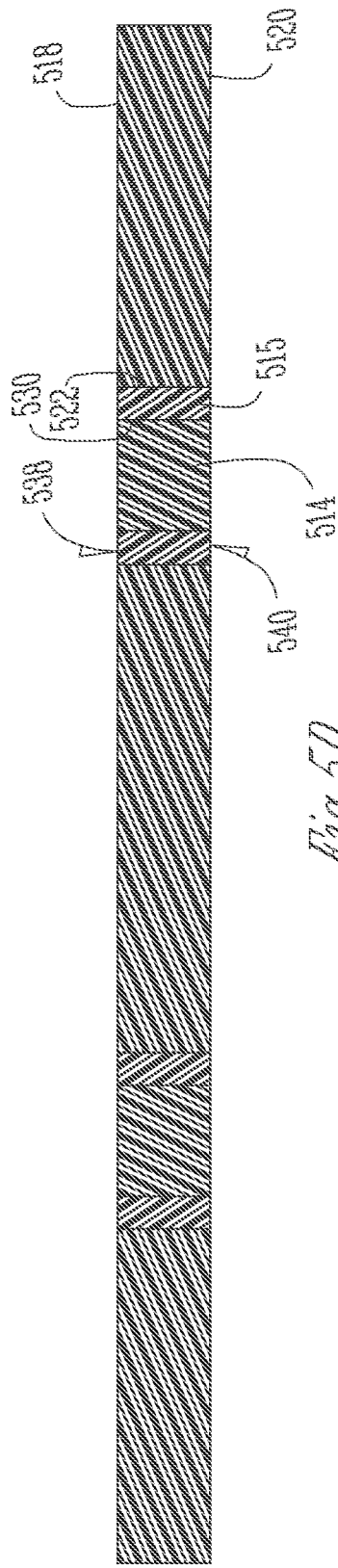
FIGS. 5A-F depict an example of a process of making an electronic circuit, according to an embodiment.

In FIG. 5B an intermediary material, such as intermediary material 515 can be disposed into the bore 522. The intermediary material 515 can include the second intermediary material, such as second intermediary material 215 or second intermediary material 315 as previously described herein. In an example, the intermediary material 515 can be dispensed into the bore 522 under pressure, such as from a syringe or from a hydraulic or pneumatic dispenser. The intermediary material 515 can be located from the first side 518 to the second side 520. For instance, the intermediary material 515 can include a first surface 538 and a second surface 540. The intermediary material 515 can include a dielectric characteristic, such as the third dielectric characteristic as previously described herein. For instance, the third dielectric characteristic can be less than the first dielectric characteristic. In the example of FIGS. 5A-F, the first dielectric characteristic can include a dielectric constant between 4.5 and 3.6. The third dielectric characteristic can include a dielectric constant between 3.5 and 2.6.

A hole, such as the hole 530, can be formed in the intermediary material 515 as shown in the example of FIG. 5C. For instance, the hole 530 can be formed from the first surface 538 to the second surface 540. In an example, the hole 530 can be mechanically drilled, laser drilled, or formed by another process. As shown in FIG. 5C, the hole 530 can be substantially transverse (e.g., within five-degrees) to the first side 518 or the second side 520.

As shown in the example of FIG. 5D, an intermediary material, such as intermediary material 514 can be disposed in the hole 530. In an example, the intermediary material 514 can include the first intermediary material 114, 214, or 314. For instance, the intermediary material 514 can be disposed in the hole 530 by the same or a similar process as the intermediary material 515 is dispensed into the bore 522. In a further example, the intermediary material 514 can be disposed into the hole 530 by another process. In some examples, the intermediary material 514 can be disposed from the first surface 538 to the second surface 540 or parallel with the first side 518 or the second side 520. The intermediary material 514 can include a dielectric characteristic, such as the second dielectric characteristic as previously described herein. For instance, the second dielectric characteristic can be less than the first dielectric characteristic and the third dielectric characteristic. In some examples, the second dielectric characteristic can include a dielectric constant less than 2.5.

Figure 5E:
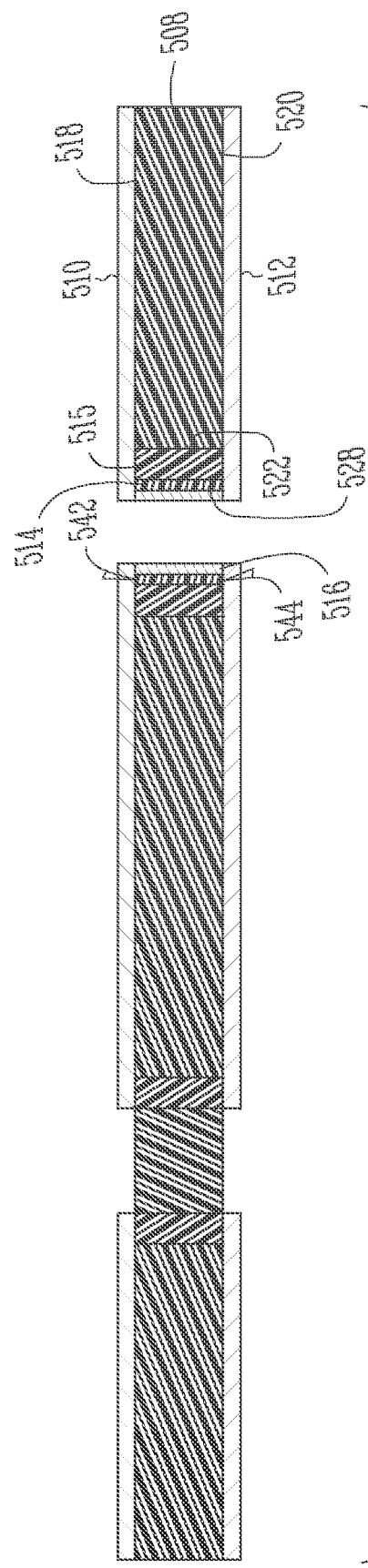
Figure 5H:
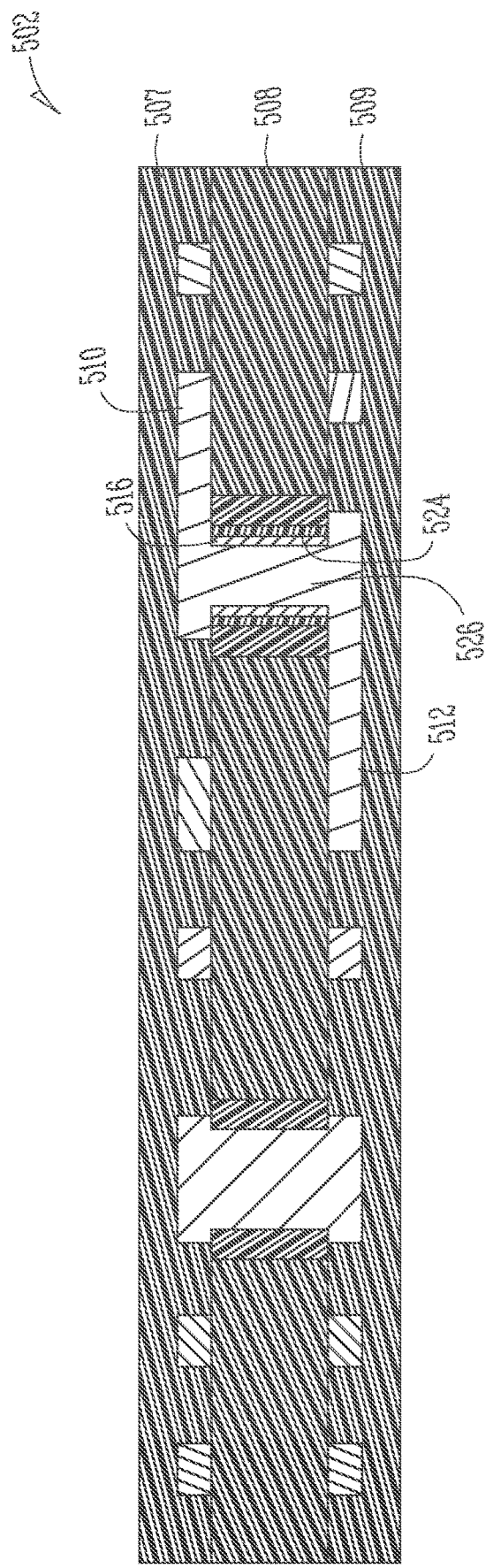

As shown in the example of FIG. 5E, a hole, such as hole 528, can be formed in the intermediary material 514. For instance, the hole 528 can be formed through the intermediary material 514, such as from a first surface 542 to a second surface 544. In an example, the hole 528 can be mechanically drilled, laser drilled, or formed by another process. As shown in FIG. 5E, the hole can be substantially transverse (e.g., within five-degrees) to the first side 518 or the second side 520. A conductive material can be disposed in the hole 528 to form a conductive path 516. In various examples, disposing the conductive material in the hole 528 can include, but is not limited to, disposing the conductive material onto the side surface of the hole 528 by vapor deposition, chemical deposition, evaporative deposition, sputtering, electroplating (e.g. electroless or electrolytic plating), or other process. In the example of FIG. 5E, the conductive material can be disposed on the intermediary material 514 and the intermediary material 515. For instance, the conductive material (e.g. the first conductive layer 510 or the second conductive layer 512) can be disposed on the first surface 538, first surface 542, the second surface 540, or the second surface 544 through the example electroplating process as previously described. Disposing the conductive material in the hole 528 or on the intermediary material 514 or the intermediary material 515 can electrically couple the conductive material (e.g., the conductive path 516) to the first conductive layer 510 and the second conductive layer 512. In an example, conductive layer such as the first conductive layer 510 or the second conductive layer 512, can be disposed on the substrate 508 through lamination process. In other examples, the conductive layer, such as conductive layer 510 or 512, can be disposed on the substrate 508 at the beginning of process step. For instance, the conductive layer can be disposed on the substrate 508 prior to forming bore 522.

The conductive layer can include a relatively small cross-sectional area (e.g., along a direction of signal propagation) compared to the cross-sectional area of the conductive path 516 (e.g., transverse to the longitudinal axis). For instance, the thickness of the conductive layer (e.g., conductive layer 510 or 512) can be smaller than the thickness of the conductive path 516. Accordingly, an impedance mismatch can exist between the conductive path 516 and one or more conductive layers, such as the conductive layer 510 or conductive layer 512.

The intermediary material 514 or the intermediary material 515 can reduce the impedance mismatch between the conductive path 516 and one or more conductive layers, such as conductive layer 510 or conductive layer 512. For instance, where the dielectric constant of the intermediary material 514 is lower than the dielectric constant of the substrate 508, the capacitance between the conductive path 516 and adjacent conductive path(s) associated to a reference voltage (e.g. Vss or ground) can be reduced. By reducing the capacitance of the material (e.g., the intermediary material 514) in the proximity (e.g., at least partially surrounding) the conductive path 516, the impedance of the conductive path 516 can be increased. Accordingly, the impedance of the conductive path 516 can be closer to the impedance of the first conductive layer 510 or the second conductive layer 512. In some examples, decreasing the impedance mismatch between the conductive path 516 and the conductive layers, such as the first conductive layer 510 or the second conductive layer 512, can reduce reflection of electrical signals, reduce electrical losses, or reduce standing waves within the conductive path. Consequently, system margin can be increased due to improved signal integrity, package size can be decreased, or any combination thereof.

In the example of FIG. 5F, the conductive path 516 can include a lumen 524. The lumen can be filled by electroplating a conductive material into the lumen 524. For instance, a filler, such as filler 526, can be electroplated copper. In other examples, the filler 526 can be disposed in the lumen 524 by vapor deposition, chemical deposition, evaporative deposition, sputtering, or the like. In an example, the conductive layer, such as the first conductive layer 510 or the second conductive layer 512 can be etched to form a circuit. For instance, the conductive layer can be formed into a routing layer (e.g., trace, contact pad to form interconnection with adjacent or subsequent conductive layers thereon). In a further example, the conductive layer can be etched or selectively deposited to form a circuit pattern (e.g., layout) along the substrate 508.

In an example, a further layer of conductive material can be deposited on the conductive layer to redistribute the signal routing, power supply or current return paths. For instance, the further layer of conductive material can be electroplated on to the conductive layer 510 or conductive layer 512 through subtractive or additive process. In an example, the further conductive layer can be electroplated during the same process as the filler 526.

In some examples, a dielectric layer, such as a dielectric layer 507 or dielectric layer 509 can be disposed on the conductive layer or the substrate 508. For instance, where the electronic circuit is a multi-layer circuit, the dielectric layer can insulate the conductive layer from additional conductive layer formed on an opposing side of the dielectric layer.

Figure 6:
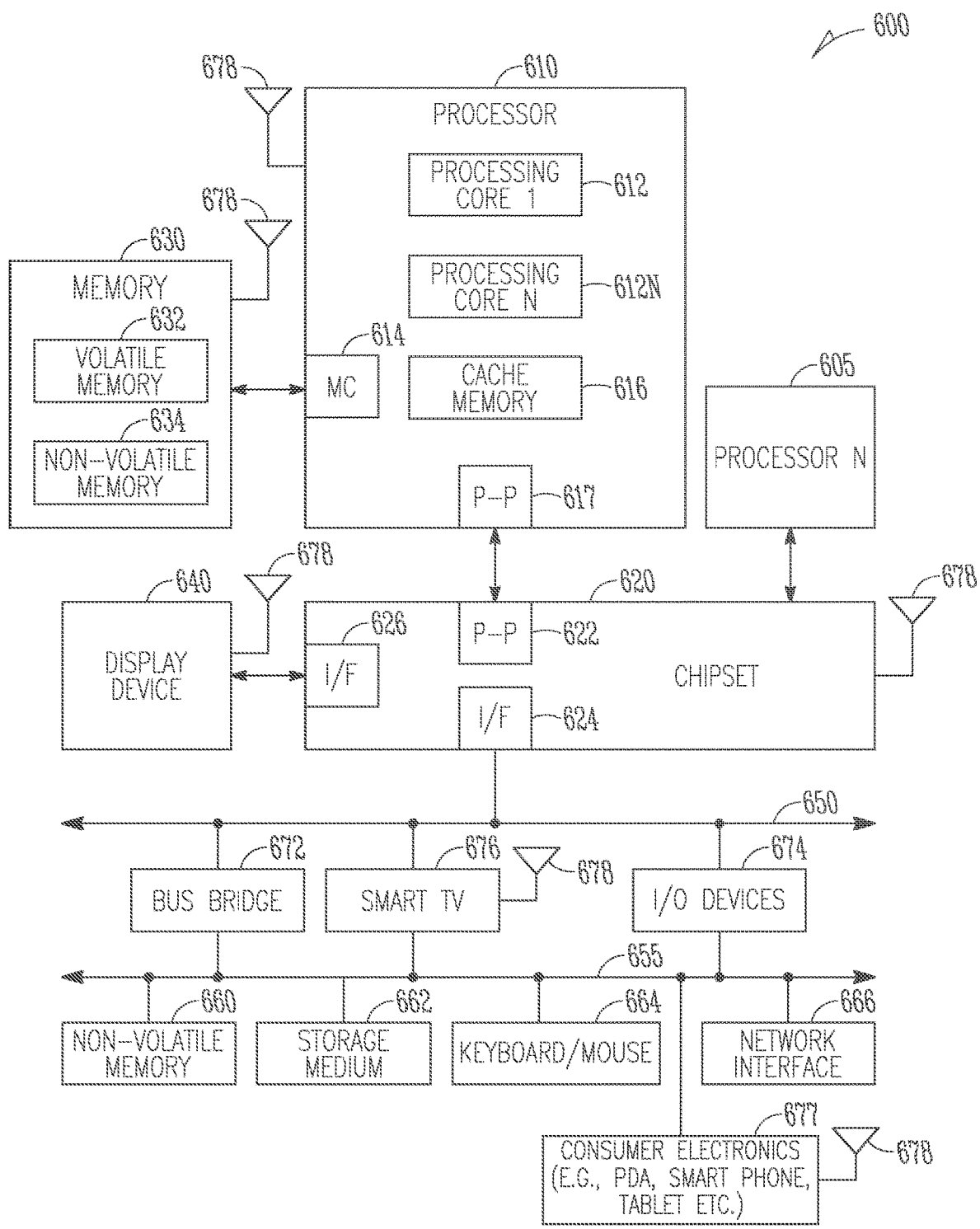
FIG. 6 illustrates a system level diagram in accordance with some embodiments of the invention.

FIG. 6 illustrates a system level diagram, according to one embodiment of the invention. For instance, FIG. 6 depicts an example of an electronic device (e.g., system) including an electronic package (e.g., electronic package 100) having an electronic circuit, such as electronic circuit 102. The electronic circuit can include a substrate having a gradiated dielectric characteristic to provide an increased impedance via as described in the present disclosure. FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In an example, the processor 610 can include the electronic package 100. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. In an example, the memory 630 can include the electronic package 100. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. In an example, the chipset 620 can include the electronic package 100. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620, via interface 624, couples with a non-volatile memory 660, a mass storage device(s) 662, a keyboard/mouse 664, a network interface 666, smart TV 676, consumer electronics 677, etc. In various examples, the electronic package 100 can be included in at least one or more of the display 640, smart TV 676, I/O devices 674, non-volatile memory 660, storage medium 662, network interface 666, processor 605, or consumer electronics device 677.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

VARIOUS NOTES & EXAMPLES

Each of these non-limiting examples may stand on its own, or may be combined in various permutations or combinations with one or more of the other examples. To better illustrate the method and apparatuses disclosed herein, a non-limiting list of embodiments is provided here:

Example 1 is an electronic circuit comprising: a substrate having a first side and a second side, the substrate including a first dielectric characteristic; an intermediary material disposed within the substrate, the intermediary material located between the first side and the second side, the intermediary material including a second dielectric characteristic, wherein the second dielectric characteristic is different than the first dielectric characteristic; a first conductive layer disposed on the first side and a second conductive layer disposed on the second side; and a conductive path electrically coupled between the first conductive layer and the second conductive layer, wherein the conductive path is in contact with at least a portion of the intermediary material.

In Example 2, the subject matter of Example 1 optionally includes wherein the substrate is a silicon substrate.

In Example 3, the subject matter of any one or more of Examples 1-2 optionally include a dimension transverse to a longitudinal axis of the conductive path, the dimension being 200 μm or less.

In Example 4, the subject matter of any one or more of Examples 1-3 optionally include wherein the conductive path is oriented transverse to the first conductive layer.

In Example 5, the subject matter of any one or more of Examples 1-4 optionally include wherein the conductive path includes a conductive filler disposed within a lumen of the conductive path.

In Example 6, the subject matter of any one or more of Examples 1-5 optionally include wherein the conductive path includes a cross sectional area transverse to a longitudinal axis of the conductive path that is at least twice a cross section area of at least the first conductive layer along a longitudinal axis of the first conductive layer proximate to a junction with the conductive path.

In Example 7, the subject matter of any one or more of Examples 1-6 optionally include wherein the intermediary material at least partially surrounds the conductive path.

In Example 8, the subject matter of any one or more of Examples 1-7 optionally include wherein the intermediary material is configured as a sleeve around the conductive path.

In Example 9, the subject matter of any one or more of Examples 1-8 optionally include wherein the intermediary material is located from the first side to the second side.

In Example 10, the subject matter of any one or more of Examples 1-9 optionally include wherein the intermediary material is located within a bore, the bore extended through the substrate from the first side to the second side.

In Example 11, the subject matter of any one or more of Examples 1-optionally include wherein a dimension between the conductive path and the substrate is between 20 μm to 50 μm.

In Example 12, the subject matter of any one or more of Examples 1-11 optionally include wherein the second dielectric characteristic is less than the first dielectric characteristic.

In Example 13, the subject matter of any one or more of Examples 1-12 optionally include wherein intermediary material includes a gradiated dielectric characteristic between the conductive path and the substrate.

In Example 14, the subject matter of any one or more of Examples 1-13 optionally include wherein the dielectric characteristic of the intermediary material includes a dielectric constant less than 3.5.

In Example 15, the subject matter of any one or more of Examples 1-14 optionally include a second intermediary material, the second intermediary material disposed within the substrate, wherein the second intermediary material is located between the intermediary material and the substrate, and the second intermediary material includes a third dielectric characteristic between the first dielectric characteristic and the second dielectric characteristic.

In Example 16, the subject matter of Example 15 optionally includes wherein a dimension between the conductive path and the second intermediary material is between 20 μm to 50 μm.

In Example 17, the subject matter of any one or more of Examples 15-16 optionally include wherein the dielectric characteristic of the intermediary material includes a dielectric constant less than 2.5.

Example 18 is a method of making an increased impedance via in an electrical circuit, comprising: disposing an intermediary material in a substrate, the intermediary material located between a first side and a second side of the substrate, wherein the substrate includes a first dielectric characteristic and the intermediary material includes a second dielectric characteristic, the second dielectric characteristic different than the first dielectric characteristic; and forming a conductive path at least partially through the intermediary material, including: forming a hole at least partially through the intermediary material, the hole extended through the substrate, disposing a conductive material in the hole to form a conductive path, and electrically coupling the conductive material to a first conductive layer and a second conductive layer.

In Example 19, the subject matter of Example 18 optionally includes wherein disposing an intermediary material in a substrate includes disposing an intermediary material in a silicon substrate.

In Example 20, the subject matter of any one or more of Examples 18-19 optionally include wherein disposing an intermediary material in a substrate includes disposing an intermediary material in a liquid state into the substrate, the intermediary material to include a solid state after being disposed into the substrate.

In Example 21, the subject matter of any one or more of Examples 18-20 optionally include wherein disposing the intermediary material in the substrate includes forming a bore in the substrate from the first side to the second side of the substrate, and filling the bore with the intermediary material.

In Example 22, the subject matter of any one or more of Examples 18-21 optionally include wherein disposing an intermediary material in a substrate includes disposing an intermediary material to be located from the first side to the second side.

In Example 23, the subject matter of any one or more of Examples 18-22 optionally include wherein disposing an intermediary material in a substrate includes disposing an intermediary material wherein the intermediary material includes a first surface that is substantially co-planar with the first side and second surface that is substantially co-planar with the second side.

In Example 24, the subject matter of any one or more of Examples 18-23 optionally include wherein disposing an intermediary material in the substrate includes disposing the intermediary material having a dielectric characteristic less than the first dielectric characteristic.

In Example 25, the subject matter of any one or more of Examples 18-24 optionally include wherein disposing an intermediary material in the substrate includes disposing the intermediary material having a gradiated dielectric characteristic between the conductive path and the substrate.

In Example 26, the subject matter of any one or more of Examples 18-25 optionally include wherein disposing an intermediary material in the substrate includes disposing the intermediary material having the second dielectric characteristic that is a dielectric constant less than 3.5.

In Example 27, the subject matter of any one or more of Examples 18-26 optionally include wherein forming the hole includes forming the hole through the intermediary material from a first surface of the intermediary material to a second surface of the intermediary material, wherein the first surface is substantially co-planar with the first side and the second surface is substantially co-planar with the second side.

In Example 28, the subject matter of any one or more of Examples 18-27 optionally include wherein forming the hole includes forming the hole having an axis that is substantially transverse to the first side.

In Example 29, the subject matter of any one or more of Examples 18-28 optionally include wherein forming the hole includes forming the hole that is surrounded by the intermediary material.

In Example 30, the subject matter of any one or more of Examples 18-29 optionally include wherein forming the hole includes forming the hole having a dimension between a side wall of the hole and the substrate is between 20 μm to 50 μm.

In Example 31, the subject matter of any one or more of Examples 18-30 optionally include wherein disposing a conductive material in the hole includes electroplating the conductive material onto a side surface of the hole.

In Example 32, the subject matter of any one or more of Examples 18-31 optionally include wherein electrically coupling the conductive material to the first conductive layer and the second conductive layer includes electrically coupling the conductive path having a cross sectional area transverse to a longitudinal axis of the conductive path that is at least twice a cross section area of at least the first conductive layer along a longitudinal axis of the first conductive layer proximate to a junction with the conductive path.

In Example 33, the subject matter of any one or more of Examples 18-32 optionally include wherein the intermediary material includes a first intermediary material and a second intermediary material, wherein the second intermediary material includes a third dielectric characteristic, the third dielectric characteristic between the first dielectric characteristic and the second dielectric characteristic, and wherein the hole is located in the first intermediary material.

In Example 34, the subject matter of Example 33 optionally includes forming a second hole in the second intermediary material, and depositing the first intermediary material in the second hole, wherein the conductive material is disposed in the hole formed of the first intermediary material.

In Example 35, the subject matter of any one or more of Examples 33-34 optionally include wherein forming the second hole in the second intermediary material includes forming the second hole wherein a side surface of the second hole includes a dimension between the side surface of the second hole and the hole in the first intermediary material is between 20 µm to 50 µm.

In Example 36, the subject matter of any one or more of Examples 33-35 optionally include wherein disposing the intermediary material in the substrate includes disposing the second intermediary material having the third dielectric characteristic that is a dielectric constant less than 3.5.

In Example 37, the subject matter of any one or more of Examples 18-36 optionally include attaching the first conductive layer to at least a first side of the substrate.

In Example 38, the subject matter of any one or more of Examples 18-37 optionally include attaching the second conductive layer to at least a second side of the substrate.

In Example 39, the subject matter of any one or more of Examples 18-38 optionally include filling a lumen of the conductive path with a conductive filler.

Example 40 is an electronic package including a substrate having a gradiated dielectric characteristic, the electronic package comprising: an electronic circuit including: a substrate having a first side and a second side, the substrate including a first dielectric characteristic, an intermediary material disposed within the substrate, the intermediary material located between the first side and the second side, the intermediary material including a second dielectric characteristic, wherein the second dielectric characteristic is different than the first dielectric characteristic, a first conductive layer disposed on the first side and a second conductive layer disposed on the second side, and a conductive path electrically coupled between the first conductive layer and the second conductive layer, wherein the conductive path is in contact with at least a portion of the intermediary material; and a die electrically coupled to the electronic circuit to electrically communicate through the conductive path.

In Example 41, the subject matter of Example 40 optionally includes wherein the substrate is a silicon substrate.

In Example 42, the subject matter of any one or more of Examples 40-41 optionally include wherein the conductive path includes a dimension transverse to a longitudinal axis of the conductive path, the dimension being 200 µm or less.

In Example 43, the subject matter of any one or more of Examples 40-42 optionally include wherein the conductive path is oriented transverse to the first conductive layer.

In Example 44, the subject matter of any one or more of Examples 40-43 optionally include wherein the conductive path includes a conductive filler disposed within a lumen of the conductive path.

In Example 45, the subject matter of any one or more of Examples 40-44 optionally include wherein the conductive path includes a cross sectional area transverse to a longitudinal axis of the conductive path that is at least twice a cross section area of at least the first conductive layer along a longitudinal axis of the first conductive layer proximate to a junction with the conductive path.

In Example 46, the subject matter of any one or more of Examples 40-45 optionally include wherein the intermediary material at least partially surrounds the conductive path.

In Example 47, the subject matter of any one or more of Examples 40-46 optionally include wherein the intermediary material is configured as a sleeve around the conductive path.

In Example 48, the subject matter of any one or more of Examples 40-47 optionally include wherein the intermediary material is located from the first side to the second side.

In Example 49, the subject matter of any one or more of Examples 40-48 optionally include wherein the intermediary material is located within a bore, the bore extended through the substrate from the first side to the second side.

In Example 50, the subject matter of any one or more of Examples 40-49 optionally include wherein a dimension between the conductive path and the substrate is between 20 µm to 50 µm.

In Example 51, the subject matter of any one or more of Examples 40-50 optionally include wherein the second dielectric characteristic is less than the first dielectric characteristic.

In Example 52, the subject matter of any one or more of Examples 40-51 optionally include wherein intermediary material includes a gradiated dielectric characteristic between the conductive path and the substrate.

In Example 53, the subject matter of any one or more of Examples 40-52 optionally include wherein the dielectric characteristic of the intermediary material includes a dielectric constant less than 3.5.

In Example 54, the subject matter of any one or more of Examples 40-53 optionally include a second intermediary material, the second intermediary material disposed within the substrate, wherein the second intermediary material is located between the first intermediary material and the substrate, and the second intermediary material includes a third dielectric characteristic between the first dielectric characteristic and the second dielectric characteristic.

In Example 55, the subject matter of Example 54 optionally includes wherein a dimension between the conductive path and the second intermediary material is between 20 µm to 50 µm.

In Example 56, the subject matter of any one or more of Examples 54-55 optionally include wherein the dielectric characteristic of the intermediary material includes a dielectric constant less than 2.5.

Example 57 is an electronic package including a substrate having a gradiated dielectric characteristic, the electronic package comprising: an electronic circuit as described in any one of Examples 1-17; and a die electrically coupled to the electronic circuit to electrically communicate through the conductive path.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic circuit comprising:
    a substrate having a first side and a second side, the substrate including a first dielectric characteristic, the substrate further including a hole transverse to the first side, the hole extending from the first side to the second side;
    a material disposed within the hole, the material including a second dielectric characteristic, wherein the second dielectric characteristic is different than the first dielectric characteristic;
    a first conductive layer disposed on the first side and a second conductive layer disposed on the second side; and
    a conductive path electrically coupled between the first conductive layer and the second conductive layer, wherein the conductive path is in contact with at least a portion of the material and traverses through the hole.

2. The electronic circuit of claim 1, wherein the material includes polytetrafluoroethylene, polyethylene, polypropylene, polystyrene, carbon disulfide, polyimide, silicon dioxide, or bismaleimide triazine.

3. The electronic circuit of claim 1, wherein the material completely surrounds the conductive path in the hole.

4. The electronic circuit of claim 1, wherein the material is configured as a sleeve around the conductive path in the hole.

5. The electronic circuit of claim 1, wherein the material is located from the first side to the second side.

6. The electronic circuit of claim 1, wherein the second dielectric characteristic is less than the first dielectric characteristic.

7. The electronic circuit of claim 1, wherein the material provides a gradiated dielectric characteristic between the conductive path and the substrate.

8. The electronic circuit of claim 7, wherein the dielectric characteristic of the material includes a dielectric constant less than 3.5.

9. The electronic circuit of claim 1, further comprising a second material, the second material disposed within the hole, wherein the second material is located between the material and the substrate, and the second material includes a third dielectric characteristic between the first dielectric characteristic and the second dielectric characteristic.

10. The electronic circuit of claim 9, wherein the dielectric characteristic of the material includes a dielectric constant less than 2.5.

11. A method of making an increased impedance via in an electrical circuit, comprising:
    forming, in a substrate, a bore transverse to a first side of the substrate and extending from the first side to a second side of the substrate;
    disposing a material in the bore, the material confined to the bore, wherein the substrate includes a first dielectric characteristic and the material includes a second dielectric characteristic, the second dielectric characteristic different than the first dielectric characteristic; and
    forming a conductive path at least partially through the material, including:
    forming a hole at least partially through the material, the hole extended through the substrate,
    disposing a conductive material in the hole to form a conductive path through the hole, and
    electrically coupling the conductive material to a first conductive layer and a second conductive layer.

12. The method of claim 11, wherein disposing the material in the substrate includes disposing the material in a silicon substrate.

13. The method of claim 11, wherein disposing the material in the substrate includes disposing the material to be located from the first side to the second side.

14. The method of claim 11, wherein disposing the material in the substrate includes disposing the material having a dielectric characteristic less than the first dielectric characteristic.

15. An electronic package including a substrate having a gradiated dielectric characteristic, the electronic package comprising:
    an electronic circuit including:

a substrate having a first side and a second side, the substrate including a first dielectric characteristic, the substrate further including a bore transverse to the first side, the bore extending from the first side to the second side;

a material disposed within the bore, the material located between the first side and the second side, the material including a second dielectric characteristic, wherein the second dielectric characteristic is different than the first dielectric characteristic;

a first conductive layer disposed on the first side and a second conductive layer disposed on the second side;

a conductive path electrically coupled between the first conductive layer and the second conductive layer and positioned in a hole in the material, wherein the conductive path is in contact with at least a portion of the material; and a die electrically coupled to the electronic circuit to electrically communicate through the conductive path.

16. The electronic package of claim 15, wherein the material at least partially surrounds the conductive path.

17. The electronic package of claim 15, wherein the material is configured as a sleeve around the conductive path.

18. The electronic package of claim 15, wherein the second dielectric characteristic is less than the first dielectric characteristic.

* * * * *